United States Patent [19]

Pascucci

[11] Patent Number: 5,754,473
[45] Date of Patent: May 19, 1998

[54] CIRCUIT FOR THE SWITCHING OF SUPPLY VOLTAGES IN ELECTRICALLY PROGRAMMABLE AND CANCELABLE NON-VOLATILE SEMICONDUCTOR MEMORY DEVICES

[75] Inventor: Luigi Pascucci, Sesto San Giovanni, Italy

[73] Assignee: SGS-Thomson Microelectronics S.r. l., Agrate Brianza, Italy

[21] Appl. No.: 835,294

[22] Filed: Apr. 7, 1997

[30] Foreign Application Priority Data

Apr. 5, 1996 [EP] European Pat. Off. ............ 96830193

[51] Int. Cl.$^6$ .................................................. G11C 11/34
[52] U.S. Cl. ............................ 365/185.18; 365/189.09
[58] Field of Search ........................... 365/185.18, 189.09

[56] References Cited

U.S. PATENT DOCUMENTS

| | | | |
|---|---|---|---|
| 5,109,187 | 4/1992 | Guliani | 323/313 |
| 5,214,606 | 5/1993 | Hashimoto | 365/185.22 |
| 5,278,785 | 1/1994 | Hazani | 365/185.16 |
| 5,333,122 | 7/1994 | Ninomiya | 365/189.11 |
| 5,550,494 | 8/1996 | Sawada | 327/69 |
| 5,576,990 | 11/1996 | Camerlenghi et al. | 365/185.23 |

FOREIGN PATENT DOCUMENTS 0 377 839 A2   7/1990   European Pat. Off. ........ G11C 16/06

Primary Examiner—David C. Nelms
Assistant Examiner—Hoai Van Ho
Attorney, Agent, or Firm—David V. Carlson; Robert E. Mates; Seed and Berry LLP

[57] ABSTRACT

A circuit for switching of power supply voltages in electrically programmable and erasable non-volatile semiconductor memory devices including a first switch-regulator block connected to a main power supply line with a programming voltage to generate a first programming voltage signal to be supplied to a memory device on a first programming line and a second switch-regulator block powered by the first programming line and designed to generate a second programming voltage to be supplied to the memory device on a second programming line. There is also provided a detector block connected to the first programming line to detect a reaching of a predetermined high level on the rising front of the first programming voltage signal and a reaching of a predetermined low level on the falling front of the first programming voltage signal and to emit at an output a corresponding enablement signal for a third regulator block located downstream.

20 Claims, 4 Drawing Sheets

CIRCUIT FOR THE SWITCHING OF SUPPLY VOLTAGES IN ELECTRICALLY PROGRAMMABLE AND CANCELABLE NON-VOLATILE SEMICONDUCTOR MEMORY DEVICES

TECHNICAL FIELD

The present invention relates to a circuit for the switching of supply voltages in electrically programmable and erasable non-volatile semiconductor memory devices.

BACKGROUND OF THE INVENTION

As known, in many applications concerning electronic devices integrated on semiconductors there is a need to power various circuit portions of the device with different voltage levels.

Generally the electronic memory devices integrated on a semiconductor can be divided in two groups, i.e., with a single power supply or a double power supply. In the former case the integrated device is supplied from the outside a single voltage value, for example a power supply voltage Vdd. In the second case there are supplied two voltage values, i.e., that of a power supply Vdd and a higher programming voltage Vpp.

For both types of devices it is however necessary to generate and/or control inside the integrated memory device appropriate and different voltage values even higher than the power supply Vdd.

In particular, in electrically programmable non-volatile memories such as EEPROM or flash EEPROM there are required different voltage values, for example:

voltages Vpcx, Vpcy, to be applied respectively to rows and columns of a cell matrix in the programming and decoding phases;

a voltage Vpd to be applied to the column in the programming phase;

voltages UPR-CG and UPR-PG for programming of the redundant circuitry UPROM; and BOOST voltages boosted starting from the power supply voltage Vdd.

To generate all these different voltage levels the prior art proposes a solution illustrated in the annexed FIG. I in which is shown a diagrammatic view of a switching circuitry of known type.

In this circuitry all the various voltage levels are virtually derived from a programming voltage Vpp which is present on a principal power supply line 2.

A first switch-regulator block 3 is connected to the line 2 and to a reference power supply voltage Vdd to generate a first programming voltage Vpcx to be supplied to a memory device on a line 6. With the block 3 is associated a voltage-booster block 4 which is structurally independent of the block 3 and which is in turn powered by the voltage Vpp and the voltage Vdd and is connected at an output to the line 6.

A second switch-regulator block 5 is powered by the line 2 and by the voltage Vdd. This block 5 is designed to generate a drain voltage Vpd to be supplied on a line II at the ends of drains of memory cells in a programming phase. The block 5 is interlocked with an activation signal VPD-cnt but is also connected downstream of a delay block 7 which emits at an output an enablement signal VPD-en for the block 5.

The delay block 7 receives at an input an activation signal VPCX-cnt which is also applied to the block 3. Consequently the delay block 7 regulates the intervention of the block 5 only after a predetermined delay after the generation of the voltage Vpcx by the block 3.

A third switch-regulator block 8 is powered by the line 2 and by the voltage Vdd. This block 8 is designed to generate a second programming voltage Vpcy to be supplied to the memory device on a line 10. The block 8 is interlocked with an activation signal VPCY-cnt.

A fourth switch-regulator block 9 is powered by the line 2 and by the voltage Vdd. This block 9 is designed to generate and regulate respective voltages UPR-CG and UPR-PG to be supplied in programming to redundancy registers UPROM through lines 12 and 13. The block 9 is interlocked with an activation signal VPP-UPR-cnt.

From the above description it is apparent that the switching circuitry provided in accordance with the prior art arises from a design philosophy which calls for the employment of switch-regulators virtually independent from each other and that they are received in the switching circuitry according to the requirement for generating various voltage levels which appeared during the evolution of the memory devices.

Although advantageous in some ways and virtually meeting the purpose, this proposed solution of the prior art displays a series of shortcomings which are set forth below.

The number of switching-regulation circuits to be managed in an independent manner in the circuitry is considerable. This can involve imprecisions in the correct sequencing of the switching (snap-back phenomena). In particular, the presence of the delay block 7 makes imprecise and unsafe the switching interval of the voltage Vpd.

In addition, there are found high impedances on the lines of current used such as that emerging from the booster block 4. This causes an imprecise correlation between the voltage level regulated upstream and the voltage level regulated downstream.

Finally, memory device configuration elements such as for example redundancy registers can be exposed to spurious alterations due to undesired 'bump' phenomena.

SUMMARY OF THE INVENTION

According to the present invention a new circuit is provided for the switching of power supply voltages in memory devices and having structural and functional characteristics overcoming the shortcomings mentioned above with reference to the prior art.

The solution underlying the present invention is to provide a 'cascade' architecture of switch-regulator blocks in such a manner that at least some of them could take power from a switch-regulator block located upstream. In this manner there is conferred greater protection of the memory device and any accidental events on the voltage values upstream would have no undesired effect on the downstream circuitry.

On the basis of this solution a circuit according to an embodiment of the invention is described for switching of supply voltages in electrically programmable and erasable non-volatile semiconductor memory devices of the type having a first switch-regulator block connected to a principal power supply line with programming voltage for generating a first programming voltage to be supplied to the memory device on a first programming line.

The characteristics and advantages of the circuit in accordance with the present invention are set forth in the description of an embodiment thereof given below by way of non-limiting example with reference to the annexed drawings.

DETAILED DESCRIPTION OF THE INVENTION

Figure 1:
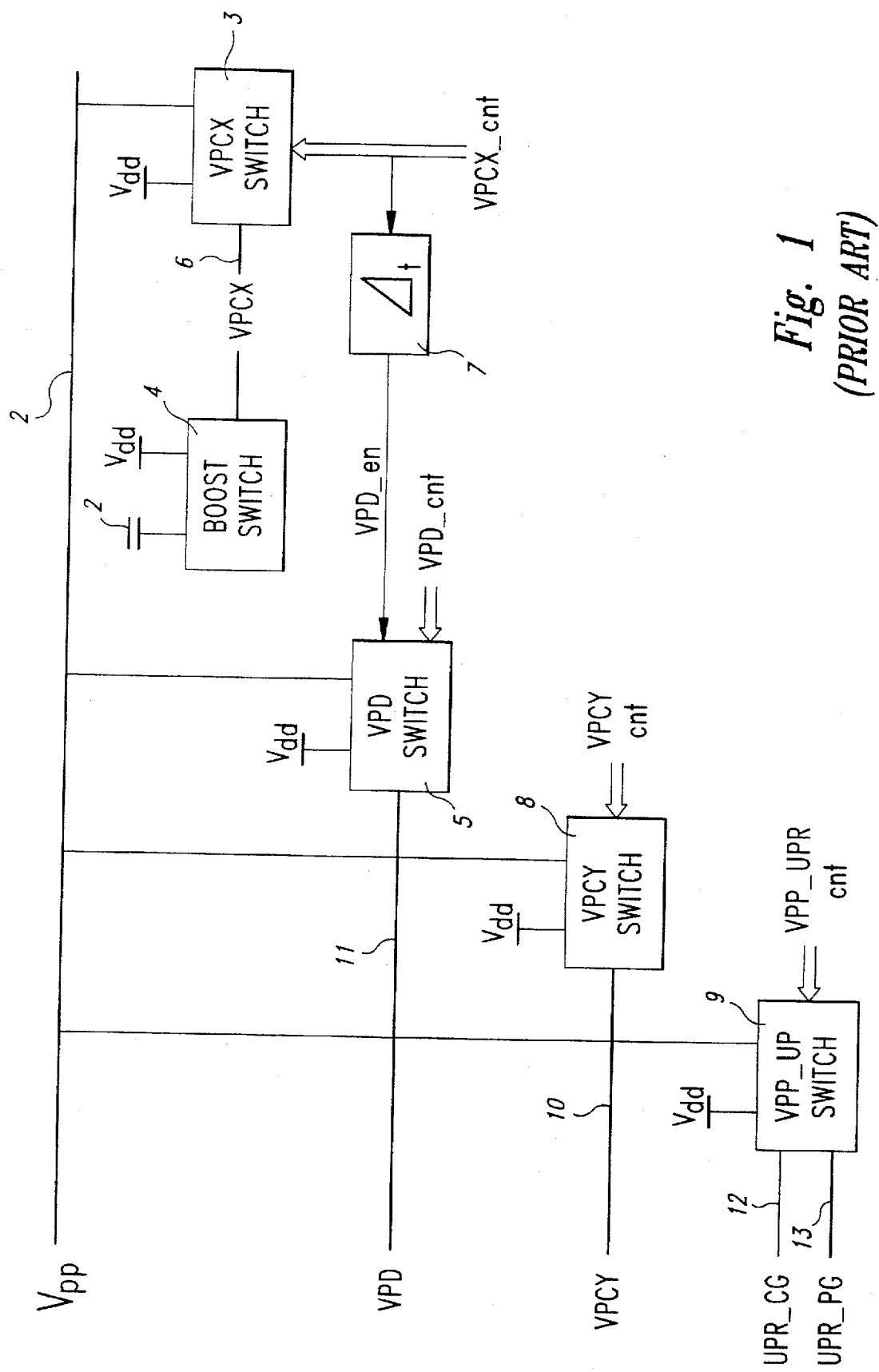
FIG. 1 shows a diagrammatic view of a switching circuit provided in accordance with the prior art.
Figure 2:
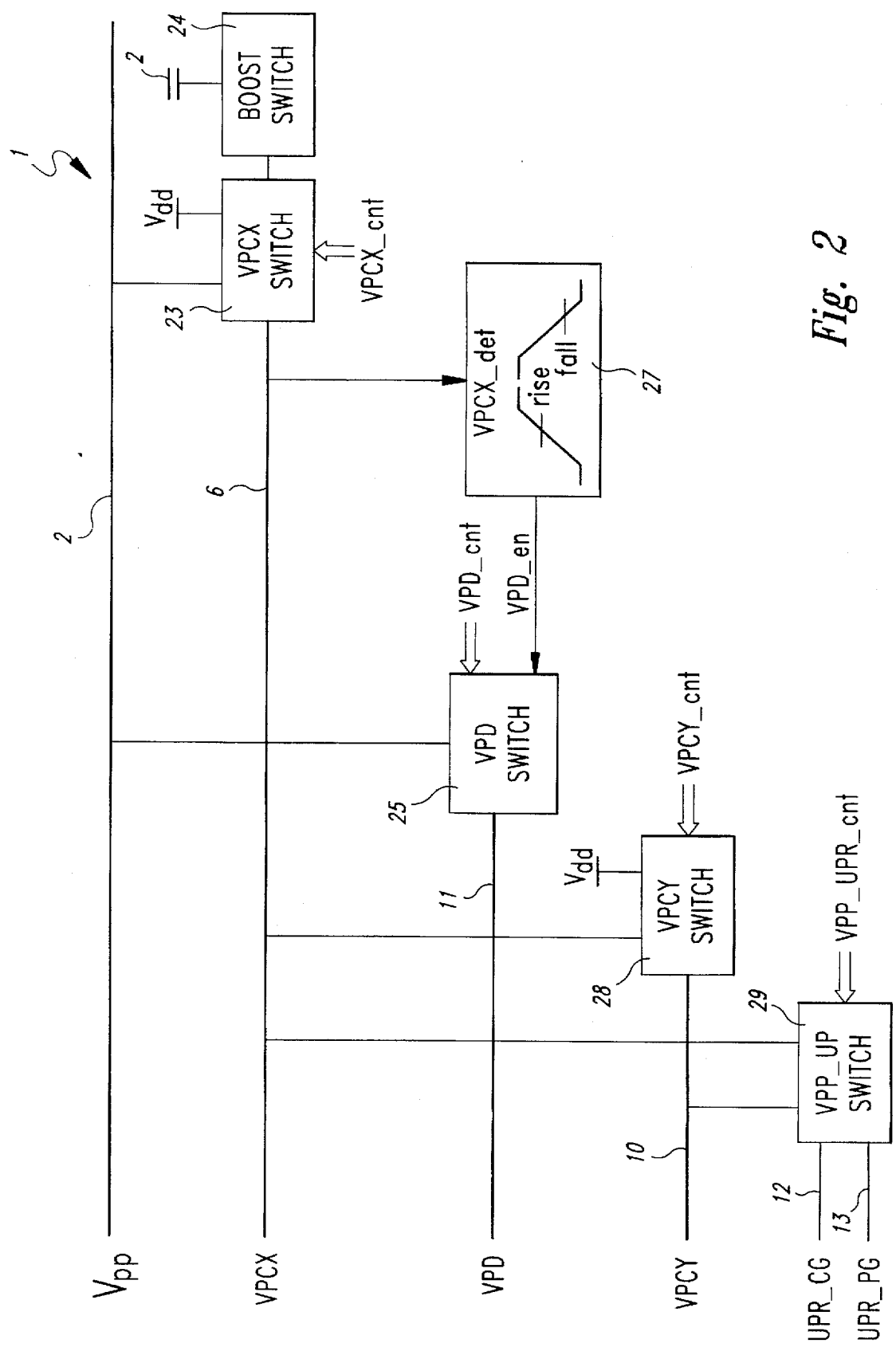
FIG. 2 shows a diagrammatic view of a switching circuit provided in accordance with an embodiment of the present invention.

With particular reference to the example of FIG. 2, reference number 1 indicates as a whole and diagrammatically a circuit provided in accordance with an embodiment of the present invention to regulate the switching of power supply voltages in an electrically programmable and erasable non-volatile semiconductor memory device.

The circuit in accordance with the present invention is designed specifically but not exclusively for a flash memory device with a double power supply and a 5-volt power supply voltage Vdd. The memory device is not shown in the drawings but is understood to be the type comprising a memory cell matrix organized in accordance with rows and columns and connected to a control, selection and decoding circuit.

The cell matrix has dimensions quantifiable in 16 megabytes and is divided in 16 segments of 1 megabyte each and with 16-bit memory words.

In the following description structural details and parts having the same function as those described for FIG. I of the prior art are represented with the same reference numbers and signs.

The circuit I in accordance with an embodiment of the present invention is powered by a programming voltage Vpp which is present on a main power supply line 2.

A first switch-regulator block 23 is connected to the line 2 and receives voltage from a power supply Vdd to generate a first programming voltage Vpcx to be supplied to the memory device on a line 6. The block 23 receives at an input an activation signal VPCX-cnt.

The block 23 is closely connected to a booster block 24 which is in turn powered by the voltage Vpp.

A second switch-regulator block 25 is powered by the line 2. This block 25 is designed to generate a drain voltage Vpd for the drain terminals of the memory cells in a programming phase. The block 25 is interlocked with an activation signal VPD-cnt.

Advantageously, in accordance with the embodiment of the present invention the block 25 is also connected downstream of a detector block 27 which emits at an output an activation signal VPD-en for the block 25.

The detector block 27 is connected to the line 6 and detects a rising front and a falling edge of the voltage Vpcx.

Specifically the block 27 detects the reaching of a predetermined high level voltage RISE on the rising front of the voltage Vpcx and the reaching of a predetermined low voltage level FALL on the falling front of the voltage Vpcx.

A third switch-regulator block 28 is powered by the line 6 and by the power supply Vdd. This block 28 is designed to generate a second programming voltage Vpcy to be supplied to the memory device on a line 10. The block 28 is interlocked with an activation signal VPCY-cnt.

A fourth switch-regulator block 29 is powered both by the line 6 and by the line 10. This block 29 is designed to generate and regulate respective voltages UPR-CG and UPR-PG to be applied in programming to redundancy registers UPROM through two lines 12 and 13. The block 29 is interlocked with an activation signal VPP-UPR-cnt.

Figure 3:
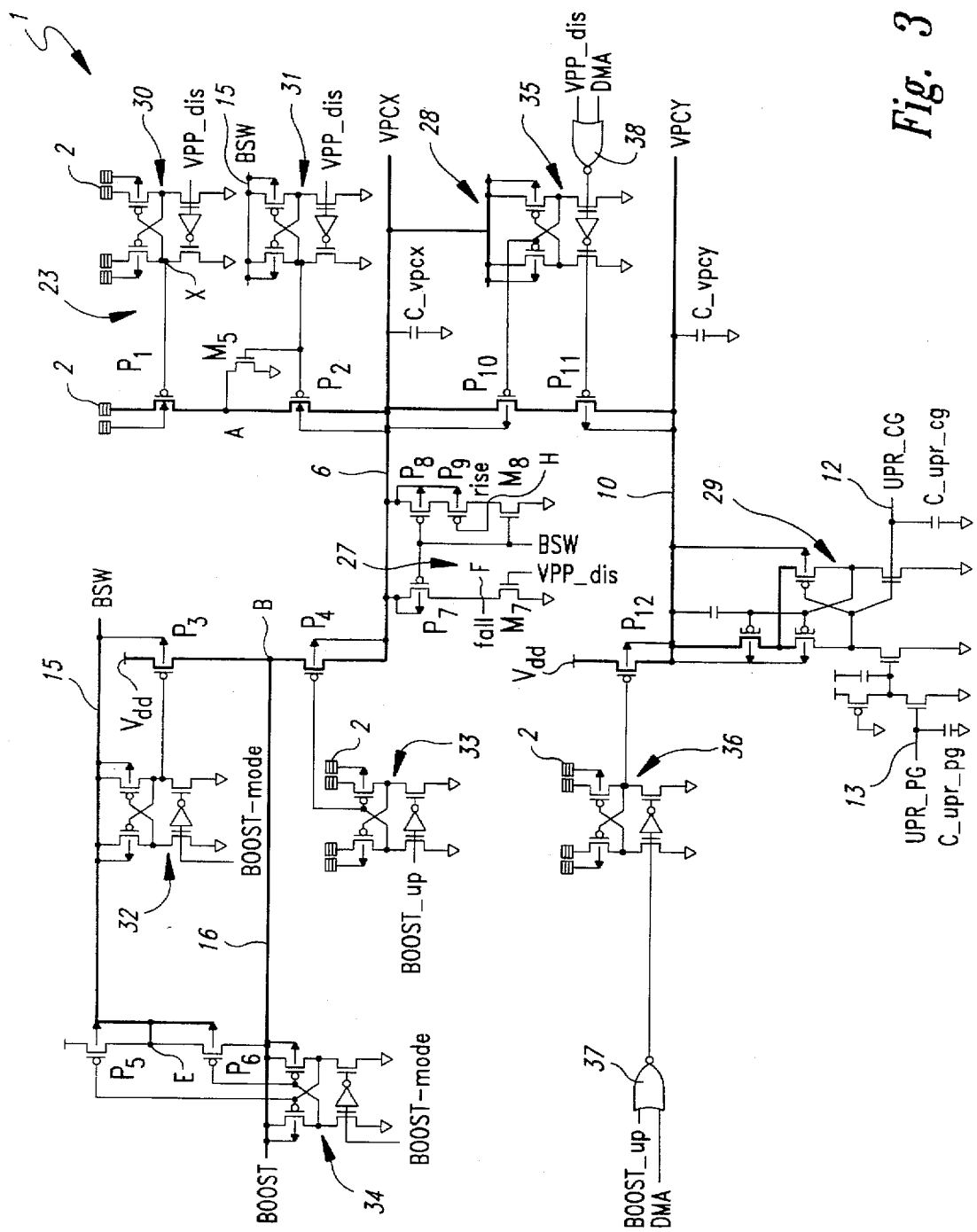
FIG. 3 shows the circuit details of the structure of the circuit of FIG. 2, and FIGS. 4 and 5 show diagrammatically respective additional details of the circuit in accordance with an embodiment of the present invention.
Figure 4:
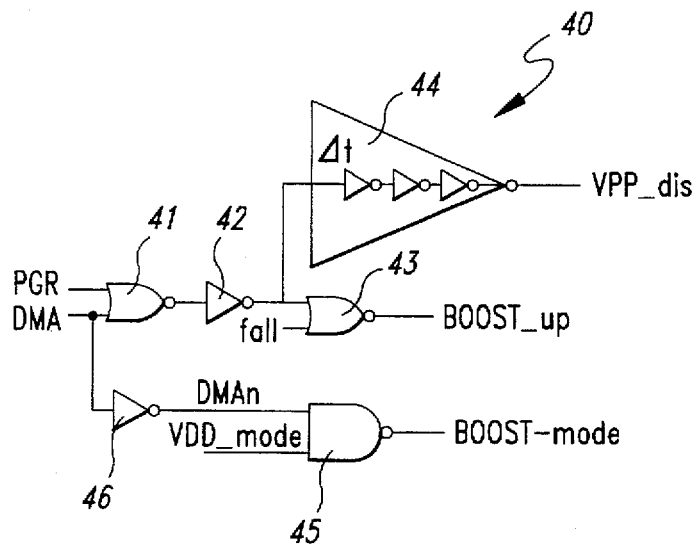
Figure 5:
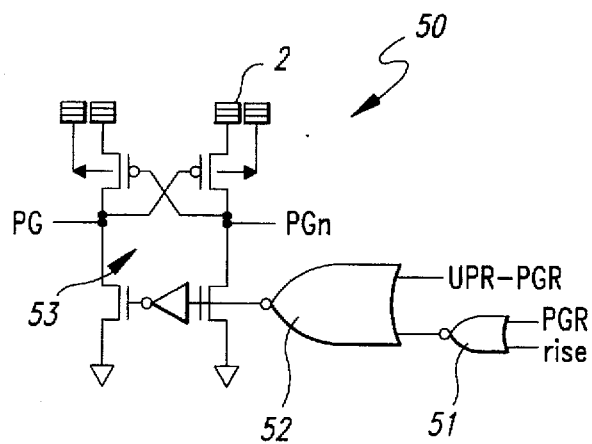

Now with specific reference to the examples of FIGS. 3, 4 and 5 there is described in greater detail the internal structure of the circuit I in accordance with the embodiment of the present invention.

With reference to FIG. 3, the line 2 of the voltage Vpp is connected to the line 6 by a series connection of two power transistors P1 and P2 of the PMOS type. The transistor P1 has a body terminal connected to the line 2 while the transistor P2 has a body terminal connected to the line 6. A point of interconnection between the two transistors P1 and P2 is identified as a node A.

A control terminal of the transistor PI is connected to an output of a voltage booster block 30. The block 30 receives at an input an enablement signal VPP-dis to force breaking of a connection between the lines 2 and 6 as explained below.

Advantageously, between the line 6 and a ground GND is present a natural charging capacitor C-vpcx due to the assembly of the devices connected to the line 6. This capacitor C-vpcx has a value of approximately 1 nF and is advantageously connected as protection from overshoots since it contributes to providing a filtering structure against accidental variations in voltage signal levels.

In the circuit I are incorporated some booster blocks having the same structure and operation as the block 30. Therefore, there is described below only once the structure of the block 30 and the various booster blocks distributed in the circuit are identified by different reference numbers with the only purpose of facilitating their location in the circuit 1. But the description of their structure will be omitted to avoid uselessly lengthening the remainder of the description.

The block 30 comprises a cell of transistors incorporating first and second complementary pairs of transistors with crossed connection.

Each pair of transistors comprises a PMOS transistor connected to a power supply, in this case to the line 2 with the voltage Vpp, and an NMOS transistor connected to a second reference voltage, for example the ground GND. The PMOS transistors of the first and second pairs of transistors have their respective body terminals connected to the power supply, i.e., to the line 2.

An interconnection node X between the PMOS and NMOS transistors of the first pair of transistors is connected to a control terminal of the PMOS transistor of the second pair of transistors. An analogous connection is provided between the second pair of transistors and a control terminal of the PMOS transistor of the first pair of transistors.

In addition, control terminals of the NMOS transistors are connected together with the interposition of an inverter. The enablement signal of the block 30 (in this case the signal VPP-dis) is applied to an input of the inverter.

An output of the block 30 is taken in the interconnection node X.

Even the second power transistor P2 has a control terminal connected to the output of a voltage booster block 31. The block 31 is connected to a BSW body switch power supply line 15 and receives at an input the signal VPP-dis.

Between the node A and the control terminal of the transistor P2 is inserted a discharging transistor Ms of the NMOS type with a grounded source terminal.

The blocks 30 and 31 can be considered incorporated in the block 23 which generates the voltage Vpcx on the line 6. The activation signal VPCX-cnt indicated in FIG. 2 is to be understood as the result of a more complex articulation of signals which are discussed in greater detail with reference to FIG. 4.

As seen above, the block 23 is powered also by the power supply Vdd.

For this purpose there is provided a second power connection between a reference power supply Vdd and the line 6. This connection comprises a series connection of two power transistors P3 and P4 of the PMOS type with the transistor P3 having a body terminal connected to the BSW line 15 while the transistor P4 has a body terminal connected to the line 6. An interconnection node between the two transistors P3 and P4 is identified as a node B.

To this node B leads a BOOST line 16 which is thus plugged in at an intermediate point of the block 23.

The transistor P3 of this second series connection has a control terminal driven by an output of a booster block 32 receiving at an input a BOOST-mode activation signal. The block 32 is powered by the BSW line 15.

Even the transistor P4 has a control terminal connected to an output of another booster block 33 which receives at an input a BOOST-up enablement signal. The block 33 is powered by the line 2 with the voltage Vpp.

Another booster block 34 is connected to the BOOST line 16 and receives at an input a BOOST-mode activation signal. The block 34 displays a double output connection with a pair of transistors P5 and P6 of the PMOS type connected between the power supply Vdd and the BOOST line 16. Specifically control terminals of the transistors P5 and P6 are respectively connected to two interconnection nodes of first and second complementary pairs incorporated in the block 34.

Body terminals of the transistors P5 and P6 as well as an interconnection node E between them are all connected to the BSW line 15.

There is now discussed in detail the structure of the detector block 27 which emits at an output an enablement signal VPD-en for the block 25 of FIG. 2.

The detector block 27 is connected to the line 6 through a first circuit branch which calls for a series connection of a transistor P7 of the PMOS type in a diode configuration connected to a transistor M7 of the NMOS type which is connected to the ground GND. On a control terminal of the transistor M7 is applied the signal VPP-dis.

Between the transistors P7 and M7 there is an interconnection node F from which is taken a FALL signal which indicates the reaching of a predetermined value on the falling front of the voltage Vpcx.

A second circuit branch of the detector block 27 comprises a series connection of a pair of PMOS transistors P8 and P9, the first of which is connected to the line 6, and an NMOS transistor M8 connected to the ground GND.

The transistors P8 and P9 are in diode configuration and the transistor P8 has a control terminal connected to a control terminal of the transistor P7 of the first circuit branch of the detector block 27.

The control terminals of the transistors P7 and P8 and the control terminal of the transistor M8 receive a BSW signal.

Between the transistors P9 and M8 there is an interconnection node H from which is taken a RISE signal which indicates the reaching of a predetermined value on the rising front of the voltage Vpcx.

There is now discussed the essential structure of the block 28 designed to generate the voltage Vpcy to be supplied to the memory device on the line 10. This block 28 is powered by the line 6 and by the power supply Vdd.

A series connection of two power transistors P10 an P11 of the PMOS type connects together the lines 6 and 10. A body terminal of the transistor P10 is connected to the line 6 while a body terminal of the transistor P11 is connected to the line 10.

Advantageously, between the line 10 and the ground GND is present a natural charging capacitor C-vpcy due to the assembly of the devices connected to the line 10. This capacitor C-vpcy has a value of approximately 0.7 nF and is advantageous as a second protection from overshoots since it contributes in turn to providing a filtering structure against accidental variations in the levels of the voltage signal.

A voltage booster block 35 is provided for driving control terminals of the transistors P10 and P11. The block 35 is powered by the line 6 and receives at an output a signal emerging from a logic gate 38 of the NOR type with two inputs.

A first input of the gate 38 receives the signal VPP-dis while on a second input of the gate 38 is applied a signal DMA. The DMA (Direct Memory Access) signal enables reading of the current of the memory cells to be able to go back to their threshold voltage.

Another power transistor P12 of the PMOS type is inserted between the power supply Vdd and the line 10. Even this transistor has a control terminal connected to an output of a voltage booster block 36.

The block 36 is powered by the line 2 with the voltage Vpp and receives at an input a signal emerging from a logic gate 37 of the NOR type with two inputs.

A first input of this gate 37 receives the BOOST-up signal and on the second input is applied the DMA signal.

The structure of the block 29 is powered both by the line 6 and by the line 10. This block 29 is designed to generate and regulate respective voltages UPR-CG and UPR-PG to be applied in programming to configuration elements of the memory device such as for example the redundancy registers UPROM through lines 12 and 13.

The block 29 comprises loads and overvoltage or electrostatic discharge protection elements which confer thereon a particular inertia towards spurious switching which might be forced by accidental events.

Details of the internal structure of the block 29 do not form a part of the present invention and thus do not need to be described in detail. The details of this circuit and alternative embodiments thereof are the subject of a U.S. patent application filed on the same date by this same applicant, titled "AUTO-SAVING CIRCUIT FOR PROGRAMMING CONFIGURATION ELEMENTS IN NON-VOLATILE MEMORY Devices," Ser. No. 08/835,296, filed Apr. 4, 1997 on for which priority is claimed based on the European Patent Application No. 96830191.1 filed on Apr. 5, 1996, is incorporated herein by reference:

There is now discussed FIG. 4 which illustrates a simple network 40 of logic gates which allow the driving of the circuit I in accordance with the present invention with a series of activation and/or enablement signals.

The network 40 comprises a first NOR gate 41 with two inputs and one output which receives a PGR signal at a first input which starts the programming and the DMA signal at a second input which starts the phase of measurement of the current of the memory cells.

The output of the gate 41 is applied through an inverter 42 to a first input of a second logic gate 43 of the NOR type with two inputs and one output. A second input of the gate 43 receives the FALL signal emerging from the detector 27.

The output of the gate 43 produces the BOOST-up signal.

The first input of the gate 43 is branched to an input of a retarder 44 which generates at an output the signal VPP-dis. This signal Vpp-dis commands a disconnection of the voltage Vpp.

The network 40 also comprises a logic gate 45 of the NAND type with two inputs and one output. This gate 45 receives on one input a VDD-mode signal and on the other input a DMAn signal which is the negation of the DMA signal taken through an inverter 46 from the second input of the gate 41.

The output of the gate 45 represents the BOOST-mode signal applied to the blocks 33 and 34.

FIG. 5 illustrates a simple network 50 of logic gates which allow driving the circuit 1 in accordance with the embodiment of the present invention with a series of activation and/or enablement signals.

The network 50 comprises a NAND logic gate 51 with two inputs and one output which receives on a first input the PGR signal for starting programming and on a second input the RISE signal emerging from the detector 27.

The output of the gate 51 is applied to a first input of a logic gate 52 of the NOR type with two inputs and one output. A second input of this gate 52 receives a signal UPR-PROG which starts the programming phase of the UPROM registers.

The output of the gate 52 is connected to an inverter of a voltage booster block 53 connected to the line 2 with the voltage Vpp. The block 53 produces on two output nodes a PG signal and a corresponding negated PGn signal.

There is discussed briefly below the operation of the circuit 1 in accordance with the embodiment of the present invention starting from an initial state in which is started the programming phase of the memory cells through the PGR signal=1.

The PGR signal thus has a high logical value and it is assumed that the DMA signal supplied to the gate 41 has a low logical value. Under these conditions the BOOST-mode signal is low if the VDD-mode signal is high. Even the BOOST-up signal is low and the BSW line 15 is brought to the value of the power supply Vdd in the programming phase.

Below the value Vdd the control returns to the line 16.

The logical value FALL is set on approximately 6V and reaches the high value when even the signal VPP-dis is high. Under these conditions the transistor P1 is extinguished and the connection between the line 2 and the line 6 is broken.

The line 6 falls to the value of approximately 6V before the FALL signal pushes the output of the gate 43 to produce a high BOOST-up signal which establish a connection between the line 6 and the line 16 through the transistor P4.

The FALL signal switches first but at the beginning is ignored. When the BOOST-up is high and FALL returns to the low value it is the BOOST line 16 which powers the line 6 VPCX.

If that is not desired, it is necessary to set high the VDD-mode signal which deactivates BOOST-mode and allows taking voltage from the power supply Vdd.

When the detector block 27 detects reaching of a predetermined voltage value, for example 10V, on the rising front of the voltage Vpcx, the value of RISE is brought high and the block 25 is enabled accurately only when the voltage Vpcx is greater than 10V which allows prevention of snapback phenomena during programming.

After programming, the line 10 is activated with a low VPP-dis signal. On the control terminal of the discharging transistor Ms is a high signal which allows discharging the line 6.

This signal is applied even to the control terminal of the power transistor P2 which however interprets this signal as relatively low.

If the DMA signal is taken high the line 10 goes to the value of the line 6.

The circuit in accordance with the embodiment of the present invention solves the technical problem and achieves numerous advantages the first of which is certainly the fact that the 'cascade' architecture of the various power lines allows conferring greater protection against spurious power supply signals directed towards the memory cell matrix and other circuit parts susceptible to change.

In particular, the fact that the drain voltage Vpd is generated following a detection on the rising front of the first programming voltage Vpcx ensures a correct switching sequence.

Furthermore, the circuit in accordance with the embodiment of the present invention incorporates a smaller number of control structures for a given function than the circuits in accordance with the prior art.

There is also obtained better entrainment of the BOOST line 16 performed with PMOS transistors in the initial phase and reduced impedance of this line with better correlation of the voltage Vpcx regulated upstream with the other voltage Vpcy regulated downstream.

Lastly, it can be stated that the circuit in accordance with the embodiment of the present invention achieves better protection of the programming circuits of the configuration elements thanks to the 'cascade' architecture of the power supply lines and to the inertial characteristics towards spurious switching signals.

I claim:

1. A power supply circuit for providing supply voltages to an electrically programmable and erasable non-volatile semiconductor memory device comprising:

a first switch-regulator block connected to a main supply line and generating a first programming voltage on a first programming line coupled to the memory device;

at least one alternate switch-regulator block connected to the first programming line to receive the first programming voltage and generating an alternate programming voltage on an alternate programming line coupled to the memory device.

2. The power supply circuit of claim 1, further comprising:

a detector block connected to the first programming line to receive the first programming voltage, the detector block detecting when a rising front of the first programming voltage reaches a selected high voltage level and when a falling front of the first programming voltage reaches a selected low voltage level, the detector block generating at an output an enabling signal;

a second switch-regulator block connected to the output of the detector block for receiving the enablement signal.

3. The power supply circuit of claim 1, further comprising a third switch-regulator block connected to the first programming line to receive the first programming voltage and being connected to the alternate programming line to receive the alternate programming voltage, the third switch-regulator block generating a plurality of voltage values in response to the first programming voltage and the alternate programming voltage to be applied to configuration elements in the memory device.

4. The power supply circuit of claim 1 wherein the first switch-regulator block comprises a series connection of two PMOS transistors, each of the PMOS transistors having a control terminal and one of the control terminals being connected to a voltage booster block to receive an enablement signal, the two PMOS transistors being coupled between the main power supply line and the first programming line.

5. The power supply circuit of claim 1 wherein the alternate switch-regulator block comprises a series connection of two PMOS transistors connected to the first programming line, each of the PMOS transistors having a control terminal and one of the control terminals being connected to a voltage booster block to receive an enablement signal.

6. The power supply circuit of claim 1, further comprising:
   a first capacitor connected between the first programming line and a ground voltage reference to protect the first programming line from a voltage overshoot; and
   a second capacitor connected between the alternate programming line and the ground voltage reference to protect the alternate programming line from a voltage overshoot.

7. A method of providing supply voltages to an electrically programmable and erasable non-volatile semiconductor memory device comprising the steps of:
   connecting a first switch-regulator block to a main power supply line;
   generating a first programming voltage in the first switch-regulator block and outputting the first programming voltage on a first programming line coupled to the memory device;
   connecting an alternate switch-regulator block to the first programming line to receive the first programming voltage; and
   generating an alternate programming voltage in the alternate switch-regulator block and outputting the alternate programming voltage on an alternate programming line coupled to the memory device.

8. The method of claim 7, further comprising the steps of:
   detecting a first time when a rising front of the first programming voltage equals a selected high voltage level;
   detecting a second time when a falling front of the first programming voltage equals a selected low voltage level; and
   enabling the alternate switch-regulator block upon the detection of the first time.

9. The method of claim 7, further comprising the steps of:
   providing a third switch-regulator block connected to the first programming line and the alternate programming line;
   generating a plurality of voltage values in response to the first programming voltage and the alternate programming voltage in the third switch-regulator block; and
   applying the plurality of voltage values to configuration elements in the memory device.

10. The method of claim 7, further comprising the steps of:
    generating a first enablement signal;
    coupling the main power supply line to the first programming line upon the generation of the first enablement signal;
    generating a second enablement signal; and
    coupling the first programming line to the alternate programming line upon the generation of the second enablement signal.

11. A circuit for switching power supply voltages in an electrically programmable and erasable non-volatile semiconductor memory device comprising a first switch-regulator block connected to a main power supply line with a programming voltage to generate a first programming voltage to be supplied to the memory device on a first programming line and at least one second switch-regulator block powered by the first programming line and designed to generate a second programming voltage to be supplied to the memory device on a second programming line.

12. The circuit in accordance with claim 11, further comprising a detector block connected to the first programming line of the first programming voltage to detect a reaching of a predetermined high level on a rising front of the first programming voltage and a reaching of a predetermined low level on a falling front of the first programming voltage and being structured to emit at an output a corresponding enablement signal for a third regulator block located downstream.

13. The circuit in accordance with claim 11, further comprising a third switch-regulator block powered both by the first programming line and by the second programming line to generate and regulate respective voltage values to be applied to configuration elements of the memory device.

14. The circuit in accordance with claim 11 wherein said first switch-regulator block comprises a connection between the first programming line and the main power supply line incorporating a series of two power transistors of the PMOS type with at least one control terminal of said power transistors being connected to an output of a voltage booster block receiving at an input an enablement signal.

15. The circuit in accordance with claim 14 wherein said voltage booster block comprises a cell of transistors incorporating two complementary pairs of transistors with a crossed connection.

16. The circuit in accordance with claim 14, further comprising a discharge transistor of the NMOS type with a grounded source terminal inserted between an interconnection node of said transistors and a control terminal of one of the power transistors.

17. The circuit in accordance with claim 11, further comprising a voltage booster block designed to produce on a line a boosted voltage with said line of boosted voltage being plugged in at an intermediate point of the first switch-regulator block.

18. The circuit in accordance with claim 11 wherein said second switch-regulator block is powered by the first programming line through a series of two power transistors of the PMOS type with at least one control terminal of said power transistors being connected to an output of a voltage booster block receiving at an input an enablement signal through a logic gate.

19. The circuit in accordance with claim 11, further comprising a capacitor for protection from overshoots between each programming line and a signal ground.

20. The circuit in accordance with claim 12 wherein said detector block comprises a first circuit branch with a complementary pair of transistors and on which is detected the predetermined low level and a second circuit branch comprising a series of a pair of PMOS transistors and an NMOS transistor on which is detected the predetermined high level.

* * * * *